United States Patent [19]

Kimata

[11] Patent Number: 4,928,158
[45] Date of Patent: May 22, 1990

[54] SOLID-STATE IMAGE SENSOR HAVING A PLURALITY OF HORIZONTAL TRANSFER PORTIONS

[75] Inventor: Masafumi Kimata, Hyogo, Japan

[73] Assignee: Mitsubishi Denki Kabushiki Kaisha, Tokyo, Japan

[21] Appl. No.: 260,135

[22] Filed: Oct. 19, 1988

[30] Foreign Application Priority Data

Oct. 20, 1987 [JP] Japan .................. 62-264977

[51] Int. Cl.$^5$ .................. H01L 29/78; H01L 27/14; H04N 3/14; G11C 19/28
[52] U.S. Cl. .................. 357/24; 357/30; 358/213.26; 358/213.28; 377/62
[58] Field of Search .................. 357/24 LF, 30; 377/57-63; 358/213.26, 213.28, 213.29

[56] References Cited

U.S. PATENT DOCUMENTS

| 4,001,878 | 1/1977 | Weimer | 357/24 LR |
| 4,280,141 | 7/1981 | McCann et al. | 357/24 LR |
| 4,577,233 | 3/1986 | Kimata . | |
| 4,581,539 | 8/1986 | Kimata . | |
| 4,583,003 | 4/1986 | Kimata . | |
| 4,774,586 | 9/1988 | Koike et al. | 357/24 LR |
| 4,807,037 | 2/1989 | Iesaka et al. | 357/24 LR |

OTHER PUBLICATIONS

M. Kimata et al "A 480×400 Element Image Sensor with a Charge Sweep Device", 1985 IEEE International Solid-State Circuits Conf. Digest of Tech. Papers (Feb. 13, 1985).
M. Kamata et al "A 512×512 Element PtSi Schottky-Barrier Infrared Image Sensor", 1987 IEEE Intern'l Solid-State Circuits Conference, Digest of Tech. Papers (Feb. 25, 1987).
M. Kamata et al "A 512×512-Element PtSi Schottky-Barrier Infrared Image Sensor", 1987 IEEE Journal of Solid-State Circuits, vol. SC-22, No. 6 (Dec. 1987).

Primary Examiner—Gene M. Munson
Attorney, Agent, or Firm—Lowe, Price, LeBlanc, Becker & Shur

[57] ABSTRACT

Vertical transfer portions are provided for the respective columns of photodetectors arranged in a matrix. A charge transfer direction of every other vertical transfer portions is opposite to that of the remaining vertical transfer portions. The charges transferred in the opposite directions are outputted in different horizontal transfer portions. The charges transferred by the two horizontal transfer portions are outputted therefrom and brought together in a united form so as to be continuously outputted.

17 Claims, 8 Drawing Sheets

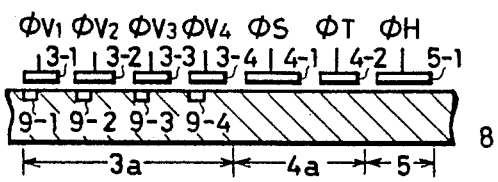
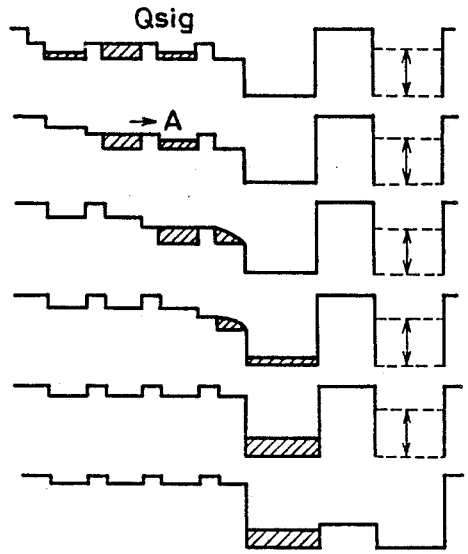
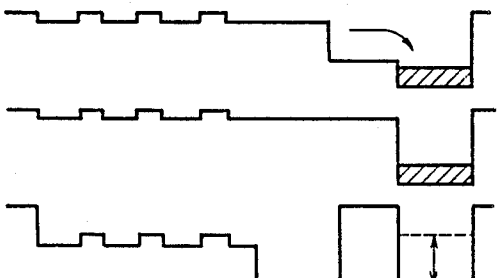
FIG. 8(a)
FIG. 8(b)
FIG. 8(c)
FIG. 8(d)
FIG. 8(e)
FIG. 8(f)
FIG. 8(g)
FIG. 8(h)
FIG. 8(i)
FIG. 8(j)

SOLID-STATE IMAGE SENSOR HAVING A PLURALITY OF HORIZONTAL TRANSFER PORTIONS

BACKGROUND OF THE INVENTION

1. Field of the Invention

The present invention relates to solid-state image sensors and particularly to a solid-state image sensor of a CSD (charge Sweep Device) system having vertical and horizontal transfer portions.

2. Description of the Prior Art

In general, a solid-state image sensor is provided with photodetectors and a scanning system on a semiconductor material of silicon or the like and if the photodetectors are suitably selected, the image sensors can pick up images in a range from a visible region to an infrared region. Such solid-state image sensors have advantages that they are small-sized with light weight and have a high reliability compared with conventional image pickup tubes and that the number of points to be adjusted in manufacturing of an image pickup apparatus is considerably decreased. Therefore, special attention is drawn toward solid-state image sensors in various fields.

Scanning systems of solid-state image sensors comprise in most cases MOS switches or CCDs (Charge Coupled Devices). In the case of a scanning system using a Mos switch, a spike noise caused by the MOS switch used for reading out a signal is mixed in the signal and as a result, and S-N ratio is lowered. In addition, the spike noise differs dependent on the columns for reading the signal, which further produces a noise called a fixed pattern noise, causing a further decrease in the S-N ratio. Consequently, the scanning system using the MOS switch cannot be used for detection of a very small signal which requires a high S-N ratio. On the other hand, in the latter scanning system using CCD, particularly in an interline CCD system widely utilized these days because of its free selection of photodetectors as in the above-mentioned MOS system, CCDs are arranged between the columns of detectors and accordingly it is desired to design the system with the areas of the CCDs as small as possible in order to increase effective areas of the detectors. A change transfer capacity of CCDs is proportional to a total area of storage gates for one stage of CCDs assuming that the same structure is adopted. Accordingly, reduction of the total area of CCDs imposes a limitation in a maximum value of charge to be handled. This becomes a serious problem particularly in the case of detecting a small signal in a large background as in an infrared ray solid-state image sensor.

Under the circumstances, there has been proposed a solid-state image sensor in which one vertical line of vertical charge transfer devices is driven as one potential well, thereby to reduce noise and to enchance a dynamic range. FIGS. 5 to 7 are diagrams for explaining operation of such a solid-state image sensor.

FIG. 5 is a block diagram of a conventional solid-state image sensor.

Photodetectors 1a to 1c arranged in three columns and four rows are connected to transfer gates 2a to 2c, respectively, so that electric signals obtained by conversion from light signals in the photodetectors 1a to 1c are transferred to vertical transfer portions 3a to 3c. The vertical transfer portions 3a to 3c are connected to interface portions 4a to 4c, respectively, so that the transferred charges are transferred to a horizontal transfer portion 5. An end of the horizontal transfer portion 5 is connected to an output terminal 7 through a preamplifier 6.

A description is hereinafter made of structure and operation of a portion related with vertical charge transfer, that is, the vertical charge transfer portion 3a and the interface portion 4a in the solid-state image sensor thus structured, with reference to FIGS. 6(a) to (j).

First, the structure of the vertical transfer portion 3a formed by a charge transfer device and the interface portion 4a will be described with reference to FIG. 6(a). The structures of the other vertical transfer portions 3b and 3c and the other interface portions 4b and 4c are the same as shown. FIG. 6(a) shows a section taken along the line VI—VI in FIG. 5. The vertical transfer portion 3a comprises four gate electrodes 3-1 to 3-4 and the interface portion 4a comprises two gate electrodes 4-1 and 4-2, an end of the interface portion 4a contacting a gate electrode 5-1. A channel is formed in a silicon substrate 8 under those gate electrodes. This channel may be a surface channel or a buried channel. Although the respective gate electrodes have gaps in FIG. 6(a), a multilayer gate electrode structure including overlaps between the respective adjacent gate electrodes may be adopted. Clock signals $\phi V1$ to $\phi V4$, $\phi S$ and $\phi T$ as shown in FIG. 7 are applied to the gate electrodes 3-1 to 3-4, 4-1 and 4-2, respectively. This example shown in the figures represents a case of an N channel and if a P channel is adopted, it is only necessary to invert the polarities of the clock signals.

Next, vertical charge transfer in the structure shown in FIG. 6(a) will be described referring to (b) to (j) of FIG. 6. FIGS. 6(b) to (j) represent states of potentials of the channel corresponding to the positions of FIG. 6(a) with the respective timings. FIG. 6(b) represents a state of a potential at the timing T1 shown in FIG. 7. At this time, the clock signals $\phi V1$ to $\phi V4$ are all at H level and accordingly a large potential well is formed under the gate electrodes 3-1 to 3-4. Since the clock signal $\phi S$ is at a higher level of than that of the clock signals $\phi V1$ to $\phi V4$ at this time, a deeper potential well is formed under the gate electrode 4-1. The clock signal $\phi T$ is at L level and accordingly a shallow potential barrier is formed under the gate electrode 4-2. On the other hand, the horizontal transfer portion 5 transfers the charge in this state and the potential level changes between the dotted lines shown in the figure.

In the above described condition, when any one of the transfer gates 2a in the vertical direction is turned on to read out a content of a detector 1a at the vertical transfer portion 3a, a signal charge Qsig exists at a predetermined position under the gate electrodes 3-1 to 3-4.

Then, at the timing T2 shown in FIG. 7, that is, at L level of the clock signal $\phi V1$, the potential well under the gate electrode 3-1 becomes shallow as shown in FIG. 6(c) and accordingly, the signal charge Qsig extends in space and is pushed toward the direction of the arrow A in FIG. 6. Subsequently, the clock signals $\phi V2$ to $\phi V4$ are successively lowered to L level at the timings T3, T4 and T5 as shown in FIG. 7 and the potentials under the gate electrodes 3-2 to 3-4 become successively shallow as shown in (d) to (f) of FIG. 6, whereby the signal charge Qsig is pushed toward the direction of the arrow A. At L level of the clock signal $\phi V4$, the signal charge Qsig is stored in the potential well under the gate electrode 4-1. The gate electrode 4-1 needs to have a size large enough to store the signal charge Qsig. However, the potential at H level of the clock signal φS does not necessarily need to be deeper than the potential under the gate electrodes 3-1 to 3-4 as shown in the above described example.

Thus, the signal charge Qsig is collected under the gate electrode 4-1 and after scanning of one horizontal line of the horizontal transfer portion 5, the clock signal φH of the gate electrode 5-1 of the horizontal transfer portion 5 contacting the gate electrode 4-2 is raised to H level and the clock signal φT of the gate electrode 4-2 is raised to H level at the timing T6 shown in FIG. 7, which the result that the potentials under the respectives gates are as shown in (g) of FIG. 6. In this case, the potential under the gate electrode 4-2 is set higher than the potential under the gate electrodes 4-1 and 5-1; however, such setting is not necessarily needed. Next, at L level of the clock signal φS at the timing T7 shown in FIG. 7, the potential under the gate electrode 4-1 becomes shallow as shown in (h) of FIG. 6 and the signal charge Qsig is moved into the potential well under the gate electrode 5-1. After that, the clock signal φT is lowered to L level at the timing T8 shown in FIG. 7, and the potential under the gate electrode 4-2 becomes shallow as shown in (j) of FIG. 6, causing the signal charge Qsig to be transferred by the horizontal transfer portion 5. The horizontal transfer portion 5 receiving the signal (the signal charge Qsig) transfers the signal to the output preamplifier 6 successively. When the signal is thus transferred to the horizontal transfer portion 5, the clock signals φV1 to φV4 and φS are raised again to H level at the timing T9 shown in FIG. 7 and the same conditions as those at the timing T1 are set, whereby the above described cycle is repeated.

Although the above described operation was related to the case of reading out the content of any one of the detectors 1a in one vertical transfer portion 3a, the same operation is performed for the respective other vertical transfer portions 3b and 3c.

In the above described manner, the charge is transferred through the potential wells as in the conventional CCD system and consequently no spike noise as in the MOS system is produced. In addition, the amount of signal charge to be accepted can be considerably increased since it is defined by the potentials of the entire area of the vertical transfer portions 3a to 3c for one vertical line, and even if a width of a channel forming the vertical signal line is reduced, a sufficiently large amount of signal charge can be accepted. Futhermore, since the interface portion 4a and the horizontal transfer portion 5 can be formed outside an array of the photodetectors 1a to 1c, there is less limitation in dimensions and it becomes easy to make large the areas of the interface portions 4a to 4c or the area of the horizontal transfer portion 5 according to a necessary amount of charge. On the other hand, in the above described example, the vertical transfer portion 3a is scanned in one horizontal period (normally, charge transfer is effected in the vertical transfer portion for a period approximately to one frame time at the maximum) and the time of existence of the signal charge Qsig in the channel is shortened. Consequently, a channel leak current can be decreased, making it possible to cause less smears around a normal image due to storage of signal charge mixed directly in the CCDs without passing through the photodetectors 1a to 1c.

FIG. 8(a) is a sectional view corresponding to FIG. 6(a) and FIG. 8(b) to (j) represent each potential of channels in the device of the structure of FIG. 8(a) in relation to the respective timings. The timing relations of the clock signals are entirely the same as in FIG. 7. described previously.

FIG. 8(a) is different from FIG. 6(a) in that small potential barrier regions 9-1 to 9-4 are formed under the respective gate electrodes. This structure is the same as that of conventional two-phase drive type CCDs and those barrier regions can be formed by the same method. In other words, in the case of buried channels, the potential barrier regions 9-1 to 9-4 can be formed by making lower the impurity concentration in the portions for those barrier regions than that of the other portions.

The drive method is the same as in the case of FIG. 6. In the case of FIG. 8, the small potential barriers are formed in the channel as shown in (b) to (j) of FIG. 8 and accordingly the charge Qsig is not widely distributed in the channel and it is divided and stored near the region of injection of the signal, according to the capacities of the wells divided by the potential barriers. As a result, transfer of the signal is effected in the form of a mass of the charge, which enchances the self-induction drift effect and improves the transfer efficiency.

FIG. 9 is an illustration showing a section taken along the transfer direction of CCDs of a four-phase drive system constituting the horizontal transfer portion of FIG. 5, as well as potentials in this portion. FIG. 10 is a timing chart showing clock pulses applied to the transfer electrodes in this portion.

Referring to those figures, transfer operation of the CCDs in the horizontal transfer portion will be briefly described shown in FIG. 8.

It is assumed in the following that the gate to which the signal φA1 is applied is the gate connected to the gate electrode 4-2.

First, in response to the clock pulses shown in FIG. 10, a voltage of H level is applied to the terminals φA1 and φA2, and a voltage of L level is applied to the terminals φA3 and φA4 out of the terminals connected to the gate electrode 11 of the horizontal transfer portion 5. Then, the potential well under the gate electrode of the silicon substrate 10 becomes as shown at time t0. At this time, the charges of $Q_A$, $Q_B$ and $Q_C$ transferred by the vertical transfer portions 3a to 3c are transferred into the potential wells formed under the two gates through the interface portions 4a to 4c and temporality stored therein. Transfer from the interface portion to the horizontal transfer portion is effected as shown in (g) to (i) of FIG. 6. The signal φA1 of the gate connected to the gate electrode 4-2 in the horizontal transfer portion is raised to H level. This H level may be the H level at the time of normal transfer operation. Then, when the signal φT is raised to H level and the signal φS is lowered to L level, the charge stored under the gate electrode 4-2 is transferred to the horizontal transfer portion. The stored charge is moved in the potential well based on the clock pulses as shown at the times t1 to t4, whereby it is successively transferred toward the preamplifier 6. Subsequently, the charges transferred from the vertical transfer portions 3a to 3c are successively transferred to the output by repeatedly applying the clock pulses in the same manner.

In the above described conventional solid-state image sensor, as the pixel size becomes microscopic, the above described transfer method can be applied suitably as for the vertical transfer portions but a difficulty is involved as for the horizontal transfer portion. Since the number of vertical transfer portions allowed to be provided with respect to the length of the horizontal transfer portion in the transfer direction is further increased when the pixel size is made microscopic, the gate through of one stage of transfer gates of the horizontal transfer portion is further reduced. For example, in the case of FIG. 9, since the number of vertical transfer portions permissible is three and the number of transfer gates required is 3×4=12 because the CCDs are of a four-phase drive type. As the pixel size becomes more microscopic, the number of transfer gates increases proportionally because the number of vertical transfer portions connected to the horizontal transfer portion of the same length increases. As a result, reduction in the pixel size has to be limited because of a short channel effect caused by reduction of the gate length or because of limitations in microstructure technology. In addition, since the number of transfer gates in the horizontal transfer portion is increased, operation frequency of the horizontal transfer portion functioning as the charge transfer device is unfavorably increased.

SUMMARY OF THE INVENTION

An object of the present invention is to provide a solid-state image sensor suitable for rendering a pixel size microscopic.

Another object of the present invention is to provide a solid-state imaqe sensor in which a transfer manner of a horizontal transfer portion is not changed although the pixel size is made microscopic, compared with the prior art.

A further object of the present invention is to provide a solid-state image sensor in which the number of transfer gates of the horizontal transfer portion is not increased in spite of the microscopic pixel size.

A further object of the present invention is to provide a solid-state image sensor in which a gate length of the horizontal transfer portion is not reduced in spite of the microscopic pixel size.

A still further object of the present invention is to provide a solid-state image sensor in which an operation frequency of the horizontal transfer portion is not increased in spite of the microscopic pixel size.

In order to accomplish the above described objects, a solid-state image sensor according to the present invention comprises: photoelectric conversion means, first vertical transfer means, first horizontal transfer means, first output means, second vertical transfer means, second horizontal transfer means, and second output means. The photoelectric conversion means is arranged at least in a first group of columns and a second group of columns and it converts a received light signal to an electric signal. The first vertical transfer means reads out and transfers a first electric signal converted by the photoelectric conversion means arranged in the first group of columns. The first horizontal transfer means comprises a first charge transfer device which reads out and transfers the first electric signal transferred by the first vertical transfer means. The first output means outputs to outside the first electric signal transferred by the first horizontal transfer means. The second vertical transfer means reads out and transfers a second electric signal converted by the photoelectric conversion means arranged in the second group of columns. The second horizontal transfer means comprises a second charge transfer device which reads out and transfers the second electric signal converted by the second vertical transfer means. The second output means outputs to outside the second electric signal transferred by the second horizontal transfer means.

The solid-state image sensor constructed as described above is provided with at least two horizontal transfer means and accordingly the number of gate electrodes constituting CCDs as the horizontal transfer means allowed to be provided with respect to the length thereof in the transfer direction is not increased in spite of the microscopic pixel size.

The foregoing and other objects, features, aspects and advantages of the present invention will become more apparent from the following detailed description of the present invention when taken in conjunction with the accompanying drawings.

BRIEF DESCRITPTION OF THE DRAWINGS

FIGS. 6(a)–6(j) are illustrations showing a cross section of a general vertical transfer portion and potential wells in that portion.

Figure 6:
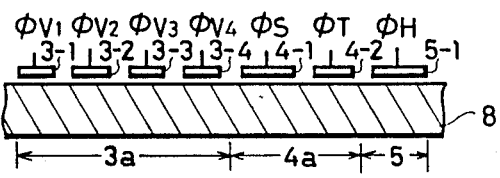
Figure 6:
Figure 6:
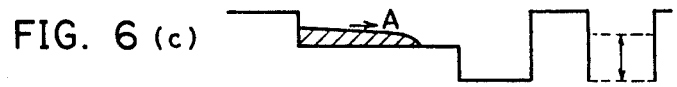
Figure 6:
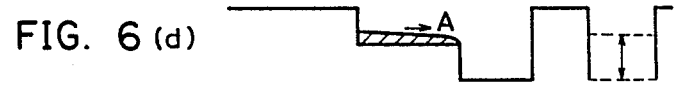
Figure 6:
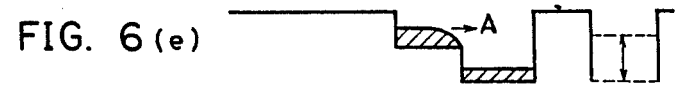
Figure 6:
Figure 6:
Figure 6:
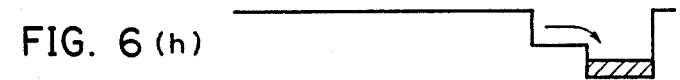
Figure 6:
Figure 6:
Figure 7:
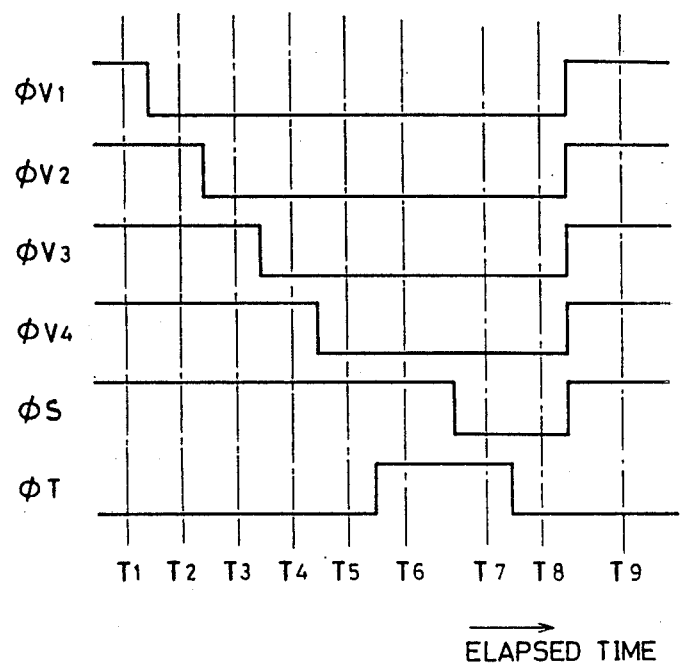

FIG. 7 is a timing chart showing clock pulses applied to transfer electrodes in FIG. 6.

FIGS. 8(a)–8(j) are illustrations showing a cross section of another example of a general vertical transfer portion and potential wells in that portion.

Figure 9:
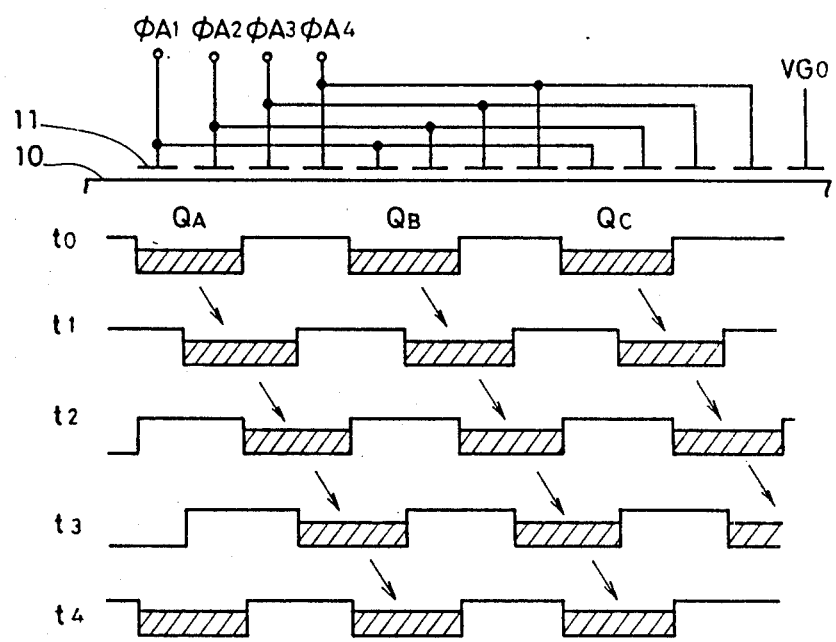

FIG. 9 is an illustration showing a cross section of a general horizontal transfer portion and potential wells in that portion.

Figure 10:
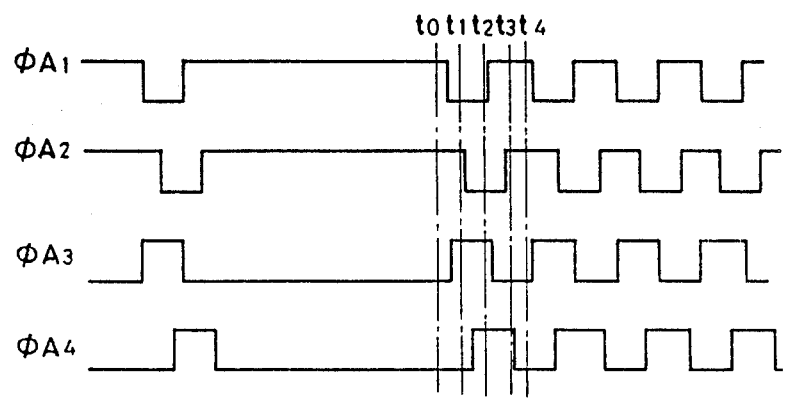

FIG. 10 is a timing chart showing clock pulses applied to transfer electrodes in FIG. 9.

DESCRIPTION OF THE PREFERRED EMBODIMENTS

Figure 1:
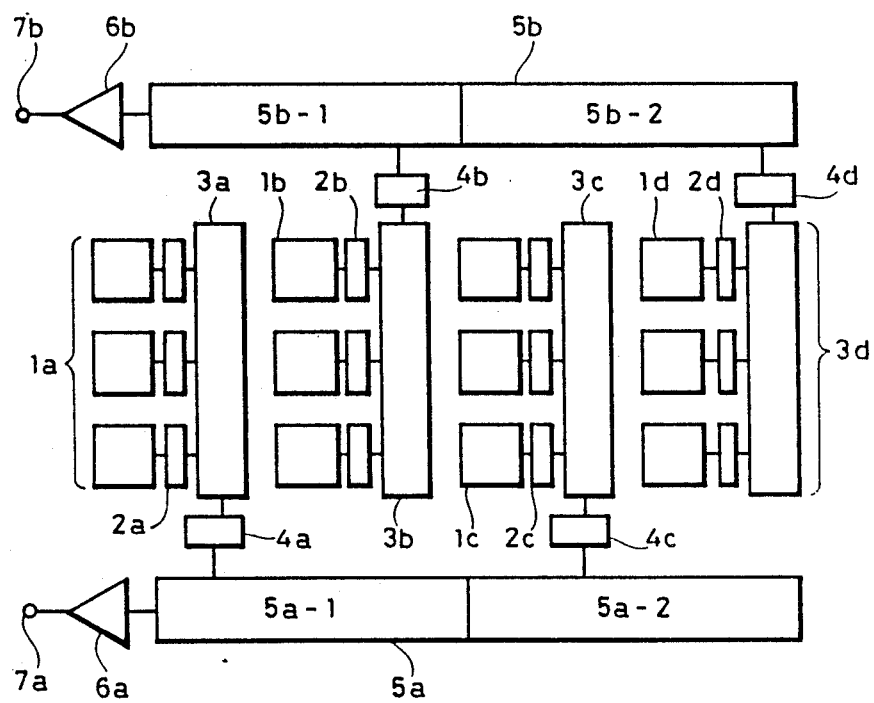
FIG. 1 is a block diagram showing an embodiment of the present invention, in which photoelectric converting portions, vertical transfer portions, horizontal transfer portions and the like are arranged.

FIG. 1 is a block diagram showing an embodiment of the present invention.

Referring to the figure, a construction of this embodiment will be described.

Photoelectrors 1a to 1d formed by photodiodes or the like arranged in four columns and three rows are connected to vertical transfer portions 3a to 3d formed by CCDs through transfer gates 2a to 2d, respectively. Transfer ends of the vertical transfer portions 3a and 3c are connected to a horizontal transfer portion 5a formed by a charge transfer device through interface portions 4a and 4c, respectively, while transfer ends of the vertical transfer portions 3b and 3d are connected to a horizontal transfer portion 5b formed by a charge transfer device through interface portions 4b and 4d, respectively. Transfer ends of the horizontal transfer portions 5a and 5b are connected to connection terminals 7a and 7b through preamplifiers 6a and 6b, respectively.

Now, operation of the solid-state image sensor thus constructed will be described.

Light signals inputted to the photodetectors 1a to 1d are converted therein to electric signals, which are successively read out at the vertical transfer portions 3a to 3d by turn-on of the transfer gates 2a to 2d, respectively. The signals read out at the vertical transfer portions 3a and 3c are transferred to the lower side of the figure through CCDs, i.e., transferred to potential wells divided in two stages 5a-1 and 5a-2 of the horizontal transfer portion 5a through the interface portions 4a and 4c, respectively. On the other hand, the signals read out at the vertical transfer portions 3b and 3b are transferred to the upper side in the figure through CCDs, i.e., transferred to potential wells divided in two stages 5b-1 and 5b-2 of the horizontal transfer portion 5b through the interface portions 4c and 4d, respectively. The signal charges read out at the horizontal transfer portions 5a and 5b are further transmitted through CCDs thereof and the transferred charges are amplified to electric signals by the preamplifiers 6a and 6b, whereby the electric signals are taken out successively from the output terminals 7a and 7b as light input information of photodetectors 1a to 1d. This cycle of sequential conversion, transfer and output operations is successively repeated so that image processing is performed.

Assuming that the CCDs used for the horizontal transfer portions 5a and 5b are of the four-phase drive type as in the conventional device, the number of necessary gate electrodes for each CCD is $2 \times 4 = 8$ since the potential wells are in two stages. In the conventional device, the number of necessary gate electrodes is $4 \times 4 = 16$ because four stages of potential wells are required. Thus, according to this embodiment, the number of gate electrodes for each CCD of the horizontal transfer portion having the same length as in the conventional device is a half of that in the conventional device. Accordingly, even if the density of pixels with respect to the longitudinal direction of the horizontal transfer portion becomes twice that in the conventional case because of the smaller pixel size, the gate length for one stage of gate electrodes is the same as in the conventional case. In addition, if the number of gate electrodes is a half of that in the conventional case, the operation frequency of the CCDs is also a half of that in the conventional case.

Figure 2:
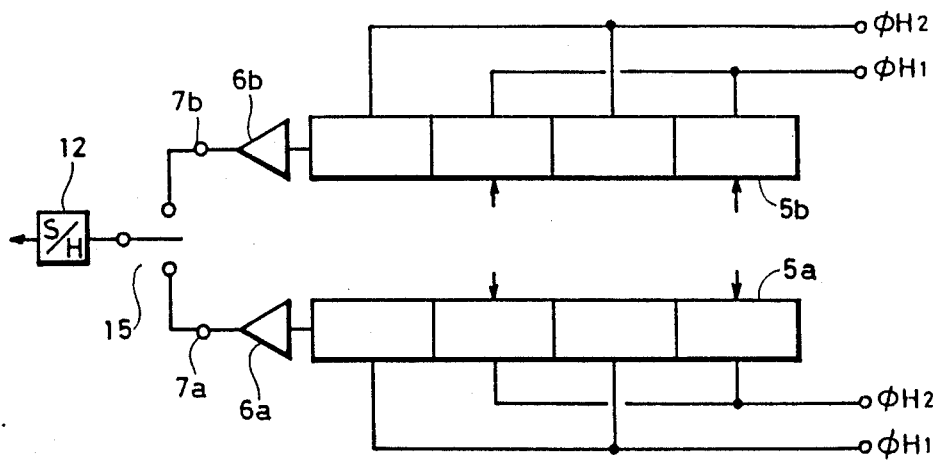
FIG. 2 is a block diagram showing processing of an output signal in the above mentioned embodiment.
Figure 3:
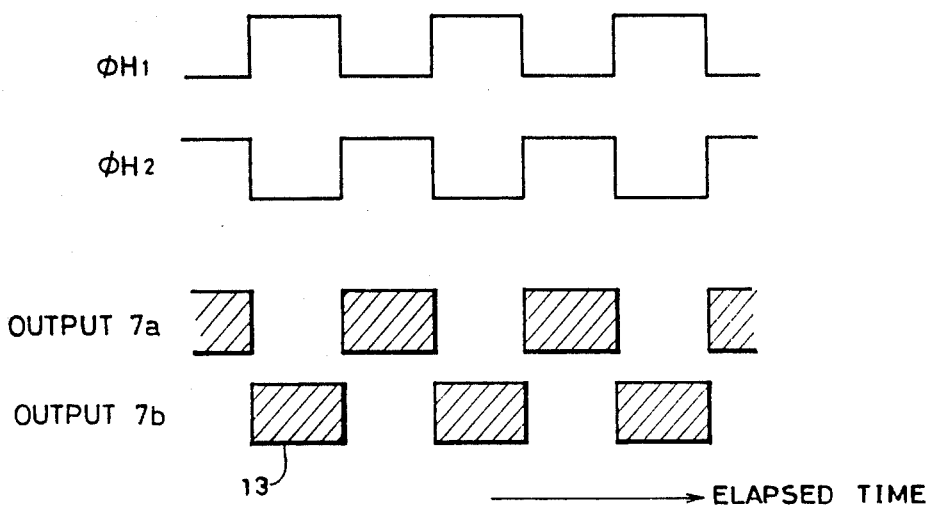
FIG. 3 is a timing chart showing clock pulses applied to transfer electrodes in FIG. 2.

FIG. 2 is a block diagram showing processing of output signals in the above mentioned embodiment and FIG. 3 is a timing chart showing clock pulses applied to transfer electrodes in FIG. 2.

In this embodiment, two horizontal transfer portions are provided as is different from the prior art and accordingly it is necessary to adjust output signals provided from the horizontal transfer portions. In the example of FIG. 2, the adjustment of the output signals is effected in the horizontal transfer portions. In the following, a brief description is given assuming that the CCDs are of a two-phase drive type for convenience of explanation.

In the example shown in FIGS. 2 and 3, two-phase clock pulses $\phi H1$ and $\phi H2$ are applied to the horizontal transfer portions 5a and 5b, respectively. Those clock pulses $\phi H1$ and $\phi H2$ are complementary pulses. The clock pulse applied to a gate at the transfer end of the horizontal transfer portion 5a is $\phi H1$, while the clock pulses applied to a gate at the transfer end of the horizontal transfer portion 5b is $\phi H2$. The outputs of the output terminals 7a and 7b are brought together as one output through a switch 15 and is supplied to a sample-and-hold circuit 12. Since the CCDs are of the two-phase drive type, the horizontal transfer portions 5a and 5b provide outputs for each cycle of the clock pulses $\phi H1$ and $\phi H2$. However, a data output period 13 for outputting data from the output ends of the horizontal transfer portions 5a and 5b in the above described construction occurs alternatively with a delay of a half of the cycle. More specifically, as shown in FIG. 1, the horizontal transfer portions 5a and 5b transfer the signal charges from the respective groups of alternate pixel columns and, accordingly, the switch 15 is turned to either side corresponding to each data output period 13, whereby the signal finally outputted from the sample-and-hold circuit can be processed in the same manner as in the case of the output signal of the prior art.

Figure 4:
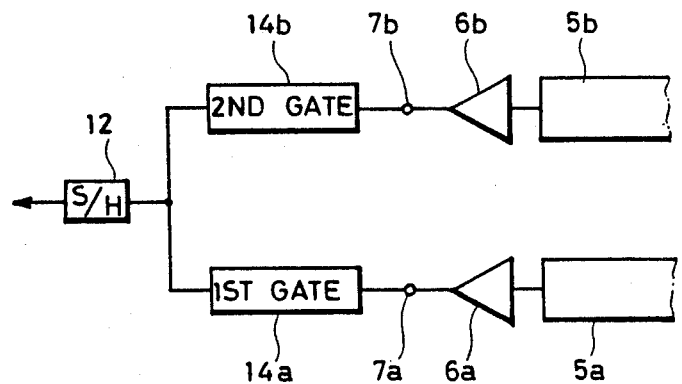
FIG. 4 is a block diagram showing processing of an output signal in another embodiment of the present invention.
Figure 5:
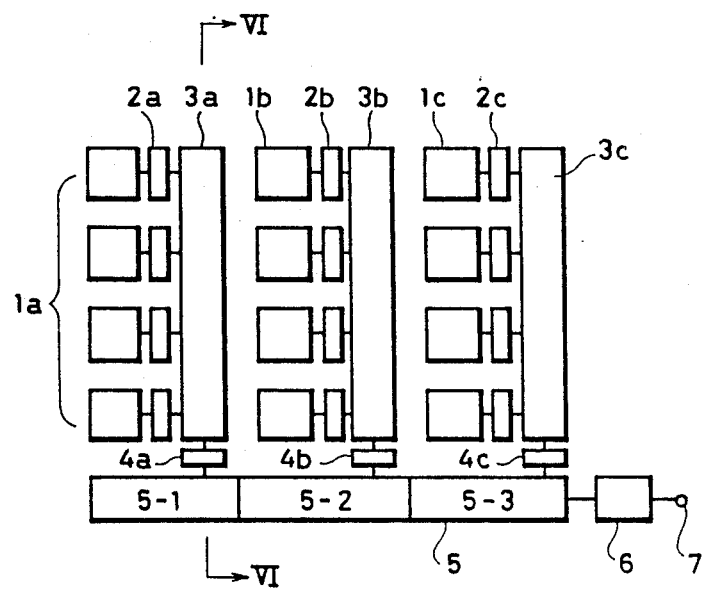
FIG. 5 is a block diagram of a conventional solid-state image sensor, in which one horizontal transfer portion is provided.

FIG. 4 is a block diagram showing processing of an output signal in another embodiment of the present invention. In this example, the output signal is adjusted outside the horizontal transfer portions.

Referring to FIG. 4, the output terminals 7a and 7b of the horizontal transfer portions 5a and 5b are connected to a first gate 14a and a second gate 14b, respectively, and the outputs thereof are brought together as one output, which is supplied to the sample-and-hold circuit 12. In this example, opening and closing timing of the first gate 14a and that of the second gate 14b are applied with a delay corresponding to a half of a drive cycle of the CCDs of the horizontal transfer portions 5a and 5b, so that data outputted from the horizontal transfer portions 5a are interpolated by data outputted by the horizontal transfer portion 5b. Accordingly, a signal finally outputted from the sample-and-hole circuit 12 can be processed in the same manner as in the case of the output signal in the prior art.

Although the transfer system in the vertical transfer portions is not specified in the above described embodiments, it may be the system shown in FIG. 6 or FIG. 8 concerning the conventional device or it may be other transfer system of CCDs. If signal charges are transferred by the system of FIG. 8, impurity regions as potential barriers are formed in part of the silicon substrate under each gate electrode; however, since such barriers are provided on the upstream side of the transfer direction, the barriers in the CCDs of the adjacent vertical transfer portions shown in FIG. 1 are not located in a line but they are located in an alternate form.

In addition, in the above described embodiments, the two horizontal transfer portions are provided, one in the upper portion and the other in the lower portion in the figures. However, four horizontal transfer portions may be provided, that is, two in the upper portion and the other two in the lower portion and if transfer of the signal charge is effected in each of the vertical transfer portions in such a case, the number of gate electrodes of the horizontal transfer portions can be further decreased to a half. Thus, a larger number of horizontal transfer portions may be provided.

Furthermore, although the transfer directions of the vertical transfer portions are different for each column, it is needless to say that the transfer directions may be different for a group of a given number of columns, not for each column.

As described in the foregoing, according to the present invention, at least two horizontal transfer means are provided and, accordingly, the necessary number of gate electrodes of the CCDs thereof with respect to a given pixel density can be decreased. Thus, pixels can be made further microscopic and, in addition, an increased in the operation frequency of the CCDs can be avoided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solid-state image sensor having a semiconductor substrate, said sensor comprising:
    a plurality of photoelectric conversion means arranged in column groups including at least a first column group and a second column group, for converting a light signal received to packets of electrical charge,
    first charge transfer means for reading out a first electric signal corresponding to a plurality of said packets of electrical charge converted by said photoelectric conversion means arranged in said first column group and transferring said first electric signal,
    second charge transfer means for reading out and transferring said first electric signal transferred by said first charge transfer means,
    first output means for outputting said first electric signal transferred by said second charge transfer means,
    third charge transfer means for reading out and transferring a second electric signal corresponding to a plurality of said packets of electrical charge converted by said photoelectric conversion means arranged in said second column group,
    fourth charge transfer means for reading out and transferring said second electric signal transferred by said third charge transfer means, and
    second output means for outputting said second electric signal transferred by said fourth charge transfer means, and wherein a direction of transfer of said first electric signal by said first vertical transfer means and a direction of transfer of said second electric signal by said second vertical transfer means are opposite to each other.

2. A solid-state image sensor in accordance with claim 1, wherein
    columns of said first column group and columns of said second column group are arranged alternately.

3. A solid-state image sensor in accordance with claim 2, wherein
    first drive pulses for driving said first charge transfer device and second drive pulses for driving said third charge transfer means are complementary to each other.

4. A solid-state image sensor in accordance with claim 3, further comprising:
    third output means for bringing said first electric signal outputted by said first output means and said second electric signal outputted by said second output means together, in an alternating sequence, into an output signal and outputting said output signal.

5. A solid-state image sensor in accordance with claim 4, wherein
    said third output means comprises switching means for successively outputting said first electric signal and said second electric signal in response to said first drive pulses and said second drive pulses, respectively.

6. A solid-state image sensor in accordance with claim 1, wherein
    said first and second vertical transfer means comprise third and fourth charge transfer devices, respectively.

7. A solid-state image sensor in accordance with claim 6, wherein
    said third and fourth charge transfer devices comprise a semiconductor substrate having a transfer region for transferring said first or second electric signal and a plurality of gate electrodes arranged over said transfer region of said semiconductor substrate in the direction of transfer of said first or second electric signal, and
    potential barriers are formed on the upstream side of said transfer direction in said transfer region under said gate electrodes.

8. A solid-state image sensor in accordance with claim 7, wherein
    said potential barriers are impurity regions having an impurity concentration lower than that of said transfer region of said semiconductor substrate.

9. A solid state image sensor as recited in claim 1, wherein
    said first charge transfer means and said third charge transfer means comprise charge swept type devices in which one of said packets of electrical charge is transferred from one of said photoelectric conversion means to a transfer channel of at least one of said first and said third charge transfer means and the potentials of portions of said transfer channel are manipulated in a manner to transfer substantially all charge contained within said one of said packets of electrical charge out of said transfer channel prior to transferring another of said packets of electrical charge from one of said photoelectric conversion means into said transfer channel.

10. A solid-state image sensor having a semiconductor substrate, said sensor comprising:
    a plurality of photoelectric conversion means arranged in column groups including at least a first column group and a second column group, for converting a light signal received to packets of electrical charge,
    first charge transfer means for reading out a first electric signal corresponding to a plurality of said packets of electrical charge converted by said photoelectric conversion means arranged in said first column group and transferring said first electric signal,
    second charge transfer means for reading out and transferring said first electric signal transferred by said first transfer means,
    first output means for outputting said first electric signal transferred by said second transfer means,
    third charge transfer means for reading out and transferring a second electric signal corresponding to a plurality of said packets of electrical charge converted by said photoelectric conversion means arranged in said second column group,
    fourth charge transfer means for reading out and transferring said second electric signal transferred by said third charge transfer means, and
    second output means for outputting said second electric signal transferred by said fourth charge transfer means, and
    third output means for bringing said first electric signal outputted by said first output means and said second electric signal outputted by said second output means together in an alternating sequence into an output signal and outputting said output signal.

11. A solid state image sensor as recited in claim 10, wherein:

Columns of said first column group and columns of said second column group are arranged alternately.

12. A solid state image sensor as recited in claim 10, wherein:

first drive pulses for driving said first charge transfer means and second drive pulses for driving said third charge transfer means are complementary to each other.

13. A solid state image sensor as recited in claim 12, wherein:

said third output means comprises switching means for successively outputting said first electric signal and said second electric signal in response to said first drive pulses and said second drive pulses, respectively.

14. A solid state image sensor as recited in claim 10, wherein:

a direction of transfer of said first electric signal by said first vertical transfer means and a direction of transfer of said second electric signal by said second vertical transfer means are opposite to each other.

15. A solid state image sensor as recited in claim 10, wherein:

said first and said third charge transfer means comprise a semiconductor substrate having a transfer region for transferring said first or said second electric signal and a plurality of gate electrodes arranged over said transfer region of said semiconductor substrate in the direction of transfer of said first or said second electrical signal, and potential barriers are formed on the upstream side of said transfer direction in said transfer region under said gate electrodes.

16. A solid state image sensor as recited in claim 15, wherein:

said potential barriers are impurity regions having an impurity concentration lower than that of said transfer region of said semiconductor substrate.

17. A solid state image sensor as recited in claim 10, wherein:

said first charge transfer means and said third charge transfer means comprise charge swept type devices in which one of said packets of electrical charge is transferred from one of said photoelectric conversion means to a transfer channel of at least one of said first and said third charge transfer means and the potentials of portions of said transfer channel are manipulated in a manner to transfer substantially all charge contained within said one of said packets of electrical charge out of said transfer channel prior to transferring another of said packets of electrical charge from one of said photoelectric conversion means into said transfer channel.

* * * * *